(12) United States Patent
Mahajan et al.

(10) Patent No.: US 7,932,604 B2
(45) Date of Patent: Apr. 26, 2011

(54) CONFIGURATION FOR MULTI-LAYER BALL GRID ARRAY

(75) Inventors: Abhijit Mahajan, Bangalore (IN); Ali Sarfaraz, Alamo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/150,905

(22) Filed: Jun. 13, 2005

(65) Prior Publication Data

US 2006/0273468 A1 Dec. 7, 2006

Related U.S. Application Data

(63) Continuation-in-part of application No. 11/115,769, filed on Apr. 27, 2005, now Pat. No. 7,633,764.

(51) Int. Cl.
*H01L 23/48* (2006.01)
(52) U.S. Cl. ............... 257/774; 257/698; 257/E23.011; 438/667
(58) Field of Classification Search .............. 257/698, 257/774, E23.036, E23.038, E23.011; 361/748, 361/760; 174/260, 262; 438/667
See application file for complete search history.

(56) References Cited

U.S. PATENT DOCUMENTS

| | | | | |
|---|---|---|---|---|
| 3,599,091 A * | 8/1971 | Warner, Jr. | .................. | 324/72.5 |
| 3,917,984 A * | 11/1975 | Kong et al. | .................. | 361/767 |
| 5,355,283 A * | 10/1994 | Marrs et al. | .................. | 361/760 |
| 5,417,578 A * | 5/1995 | Mroczkowski et al. | ....... | 439/101 |
| 5,489,804 A * | 2/1996 | Pasch | ............................ | 257/778 |
| 6,040,622 A * | 3/2000 | Wallace | ........................ | 257/679 |
| 6,245,175 B1 * | 6/2001 | Hotta et al. | .................. | 156/172 |
| 2004/0212073 A1 * | 10/2004 | Divakar et al. | ................ | 257/698 |

* cited by examiner

*Primary Examiner* — Matthew E Warren
*Assistant Examiner* — John Lin
(74) *Attorney, Agent, or Firm* — McAndrews, Held & Malloy, Ltd.

(57) ABSTRACT

Disclosed herein is a method and circuit arrangement for a multi-layer ball grid array configuration. In one embodiment, there is presented a board comprising a first surface, a second surface, and a plurality of vias. The second surface is connected to the first surface. The plurality of vias are positioned to form a substantially straight line on the first surface. The plurality of vias comprises a first via and a second via. The first via is adjacent to the second via. The first via emerges on the second surface on one side of the substantially straight line. The second via emerges on another side of the substantially straight line.

18 Claims, 5 Drawing Sheets

CONFIGURATION FOR MULTI-LAYER BALL GRID ARRAY

RELATED APPLICATIONS

This application is a continuation-in-part of and claims priority to U.S. application for patent Ser. No. 11/115,769, filed Apr. 27, 2005 now U.S. Pat. No. 7,633,764, entitled, "BALL GRID ARRAY CONFIGURATION FOR REDUCING PATH DISTANCES", by Abhijit Mahajan, et al.

FEDERALLY SPONSORED RESEARCH OR DEVELOPMENT

[Not Applicable]

MICROFICHE/COPYRIGHT REFERENCE

BACKGROUND OF THE INVENTION

Memory systems typically include memory and a memory controller. The memory can comprise a variety of devices such as Single Data Random Access Memory (SD-RAM) or Double Data Rate Random Access Memory (DDR-RAM). The memory is typically packaged as an integrated circuit. The memory controller is typically packaged as another integrated circuit.

The memory and the memory controller are typically connected to each other over a printed circuit board. The memory and memory controller include ball grid arrays. Ball grid arrays are arrays of electrical contacts, known as pins, that are physically accessible by components that are outside of the integrated circuit. The ball grid arrays are soldered to the printed circuit board. Connection paths are etched onto the printed circuit board interconnecting various pins from the memory and the memory controller. The thin small outline package (referred to as TSOP) typically comprises two rows of pins that are arranged on each of the longer side of the device. These rows of pins have a fixed pitch (spacing) between each pin.

The Joint Electron Device Engineering Committee has promulgated standards standardizing the thin small outline packaging (TSOP) pin configuration for synchronous double data rate DRAMs (DDR-SDRAMs). Pursuant to the standard, DDR-SDRAMs are typically rectangular in shape and include a row of pins along two longer sides of the rectangle.

On a multilayer printed circuit board, integrated circuits that are placed on one side of the printed circuit board access other layers of the printed circuit board by what are known as vias. Vias are holes that give access to other layers of the printed circuit board. It is generally preferable to avoid placing access points of adjacent pins too close to each other. Placement of the access points to close to each other can result in interference and crosstalk.

Further limitations and disadvantages of conventional and traditional approaches will become apparent to one of skill in the art, through comparison of such systems with some aspects of the present invention as set forth in the remainder of the present application with reference to the drawings appended hereto.

SUMMARY OF THE INVENTION

Presented herein are configuration(s) for a multi-layer ball grid array substantially as shown in and/or described in connection with at least one of the figures, as set forth more completely in the claims.

These and other features and advantages of the present invention may be appreciated from a review of the following detailed description of the present invention, along with the accompanying figures in which like reference numerals refer to like parts throughout.

DETAILED DESCRIPTION OF THE INVENTION

Figure 1:
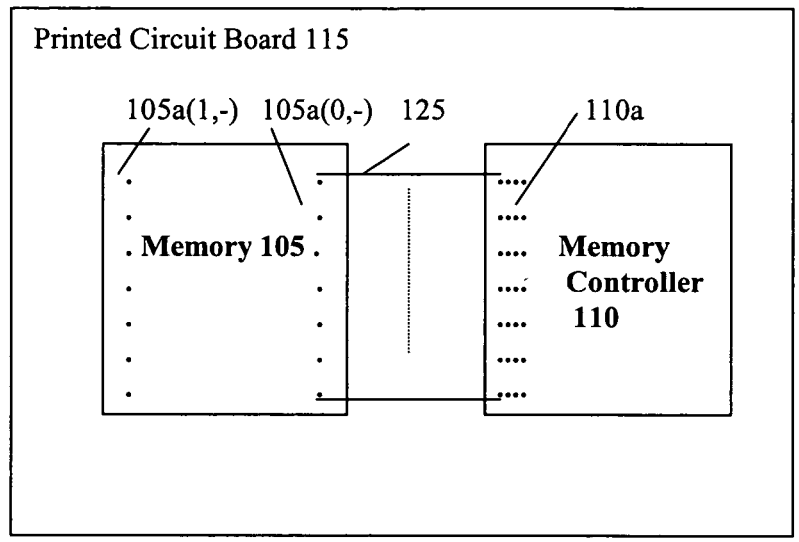
FIG. 1 is a block diagram describing a memory system in accordance with an embodiment of the present invention.

Aspects of the present invention may be found in an electronic device(s) employing a ball grid array (BGA) for operatively connecting and attaching/mounting chip packages to circuit boards, for example. A BGA may comprise a surface-mountable integrated circuit/chip package in which the integrated circuit/chip package may be operatively connected and attached to a printed circuit board by employing solder balls which are surface mounted, instead of permanently/semi-permanently attached metal leads (pins) employed in PGA packaging, for example.

A ball grid array (BGA) may comprise a chip package having solder balls applied/disposed along an underside of the chip package, for example. The solder balls-may be employable for mounting the chip package to a printed circuit board (PCB), for example. The solder balls may be employable for conductively/operatively connecting inputs/outputs of the chip package to associated connection points on a printed circuit board (PCB), for example. A ball grid array may be a type of chip package connection methodology employing a plurality of solder dots, or balls, arranged to permit interaction between the chip package and the printed circuit board.

Aspects of the present invention may be found in employing a ball grid array (BGA) to reduce connection paths, provide enhanced electrical performance, provide better heat dissipation, provide greater module density on printed circuit boards, and enhance signal transmission quality, signal transmission speed, and signal reception characteristics.

Aspects of the present invention may be found in an electronic device(s) employing a ball grid array (BGA) for operatively connecting and attaching/mounting chip packages to circuit boards, for example. A BGA may comprise a surface-mountable integrated circuit/chip package in which the integrated circuit/chip package may be operatively connected and attached to a printed circuit board by employing one of metal, and/or ceramic solder balls, instead of permanently/semi-permanently attached metal leads (pins) employed in PGA packaging, for example.

A ball grid array (BGA) may comprise a chip package having solder balls applied/disposed along an underside of the chip package, for example. The solder balls may be employable for mounting the chip package to a printed circuit board (PCB), for example. The solder balls may be employable for conductively/operatively connecting inputs/outputs of the chip package to associated connection points on a printed circuit board (PCB), for example. A ball grid array may be a type of chip package connection methodology employing a plurality of solder dots, or balls, arranged to permit interaction between the chip package and the printed circuit board.

Aspects of the present invention may be found in employing a ball grid array (BGA) to reduce connection paths, provide enhanced electrical performance, provide better heat dissipation, provide greater module density on printed circuit boards, and enhance signal transmission quality, signal transmission speed, and signal reception characteristics.

Referring now to FIG. 1, there is illustrated a block diagram a memory system 100 in accordance with an embodiment of the present invention. The memory system 100 comprises a memory 105 and a memory controller 110. The memory 105 can comprise, for example, an DDR-SDRAM or the like, and is packaged as an integrated circuit. The memory controller 110 is packaged as another integrated circuit.

The memory 105 and the memory controller 110 connected to each other over a printed circuit board 115. The memory 105 includes a TSOP packaging and memory controller 110 include ball grid arrays, 105a, 110a, respectively. Ball grid arrays, e.g., 110a, are arrays electrical contacts, known as pins, that are physically accessible by components that are outside of the integrated circuit. The ball grid arrays 105a, 110a are soldered to the printed circuit board 115. Connection paths 125 are etched onto various layers of the printed circuit board interconnecting various pins from the memory and the memory controller. Vias are employed to gain access to the inner and bottom layers of the printed circuit board.

The Joint Electron Device Engineering Committee has promulgated standards standardizing the arrangement for DDR-SDRAMs packaged in a TSOP packaging. Pursuant to the standard Double Data Rate SDRAM Specification (Document Number: JESD97(D,C), which is incorporated herein by reference, DDR-SDRAMs are typically rectangular in shape and include a row of pins $105a(0,-)$, $105a(1,-)$ along two opposite sides of the rectangle.

Figure 2:
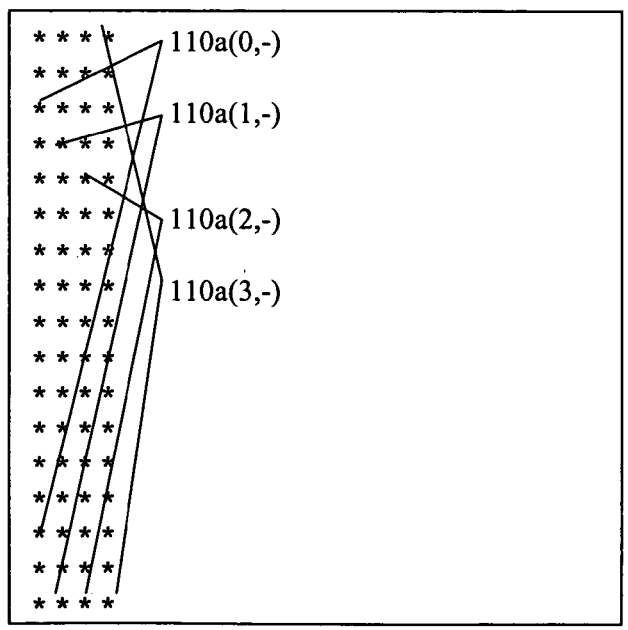
FIG. 2 is a block diagram of the memory controller in accordance with an embodiment of the present invention.

Referring now to FIG. 2, there is illustrated a block diagram of an exemplary memory controller 110. The memory controller 110 can be rectangular and comprises a ball grid array 110a. The ball grid array 110a comprises four rows of pins $110a(0,-)$, $110a(1,-)$, $110a(2,-)$, and $110a(3,-)$ along one edge of the rectangle. The rows are alternatingly signal and ground, such that the pins in rows $110a(0,-)$ and $110a(2,-)$ carry signals, and the pins in rows $110a(1,-)$ and $110a(3,-)$ are grounds or vice versa. According to certain aspects of the present invention, the four rows of pins $110a(0,-)$, $110a(1,-)$, $110a(2,-)$, and $110a(3,-)$ are along an edge of the rectangle that is nearest to the memory 105.

Figure 3:
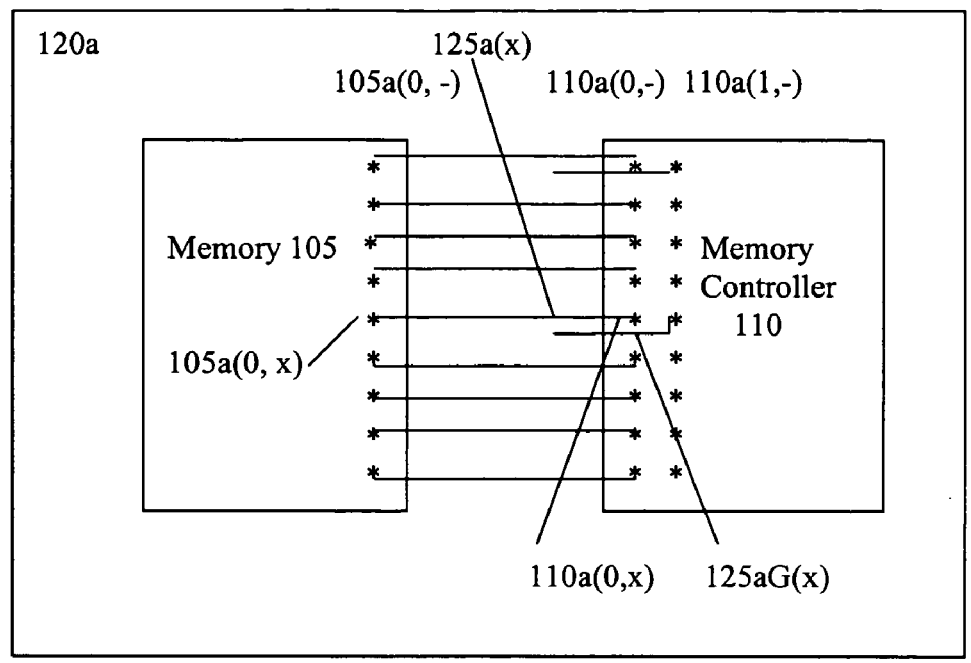
FIG. 3 is a block diagram of one layer of the memory system in accordance with an embodiment of the present invention.

Referring now to FIG. 3, there is illustrated a block diagram of one layer of the printed circuit board 120a, in accordance with an embodiment of the present invention. The layer 120a faces the package housing of the memory 105 and the memory controller 110. The row of pins $110a(0,-)$ can be connected to the row of pins on the memory 105 that are nearest to the memory controller, e.g., row $105a(0,-)$. According to certain aspects of the present invention, the memory controller 110 can be configured, such that each sequential pin of row $110a(0,x)$ connects to a corresponding sequential pin of row $105a(0,x)$. Each pin of row $110a(0,x)$ can be connected to a corresponding pin of row $105a(0,x)$ by a connection path $125a(x)$. As can be seen, the connection path $125a(x)$ can be the most direct path between the pins.

Each pin of row $110a(1,-)$ can be connected to ground GRND by corresponding connection paths $125aG(x)$ that runs substantially along and between connection paths $125a(x)$ and an adjacent path. In the foregoing manner, crosstalk between adjacent connection paths are reduced.

Figure 4:
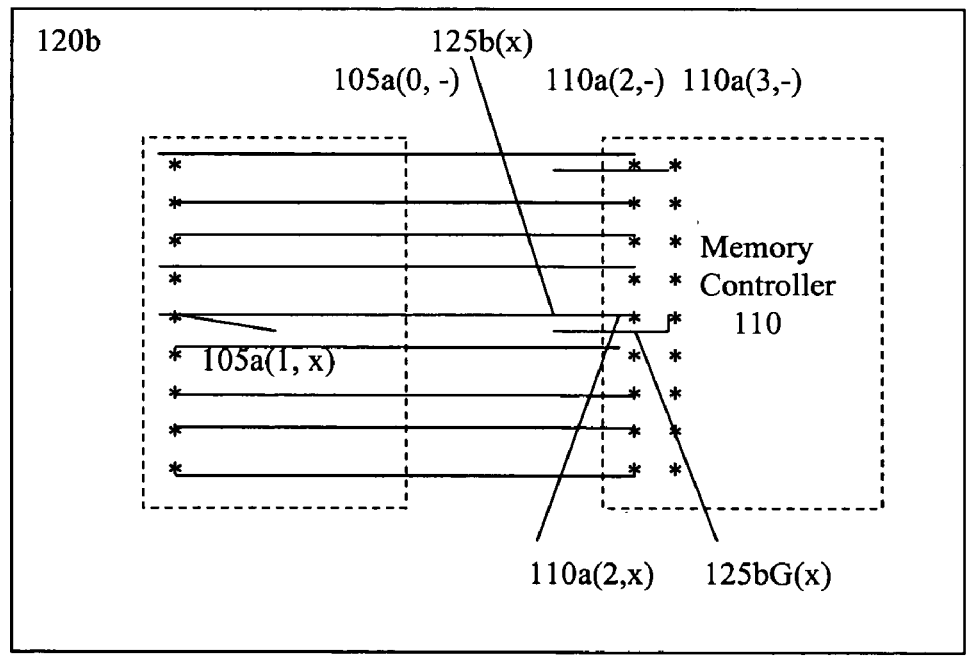
FIG. 4 is a block diagram of another layer of the memory system in accordance with an embodiment of the present invention.

Referring now to FIG. 4, there is illustrated a block diagram of another layer of the printed circuit board 120b in accordance with an embodiment of the present invention. The layer of printed circuit board 120b faces away from the package housing of the memory 105 and the memory controller 110. The rows of pins $105a(1)$, $110a(2,-)$ and $110a(3,-)$ are connected to layer 120b by what are known as vias 405. A via is a conductive hole that in the printed circuit board 115. A connection can be placed through the via 405 to make contact with layer 120b. The row of pins $110a(2,-)$ can be connected to the row of pins on the memory 105 that are furthest from the memory controller, e.g., row $105a(1,-)$. According to certain aspects of the present invention, the memory controller 110 can be configured, such that each sequential pin of row $110a(2,x)$ connects to a corresponding sequential pin of row $105a(1,x)$. Each pin of row $110a(2,x)$ can be connected to a corresponding pin of row $105a(1,x)$ by a connection path $125b(x)$. As can be seen, the connection path $125b(x)$ can be the most direct path between the pins.

Each pin of row $110a(3,-)$ can be connected to ground GRND by corresponding connection paths $125bG(x)$ that runs substantially along and between connection paths $125b(x)$ and an adjacent path. In the foregoing manner, crosstalk between adjacent connections are reduced.

Figure 5:
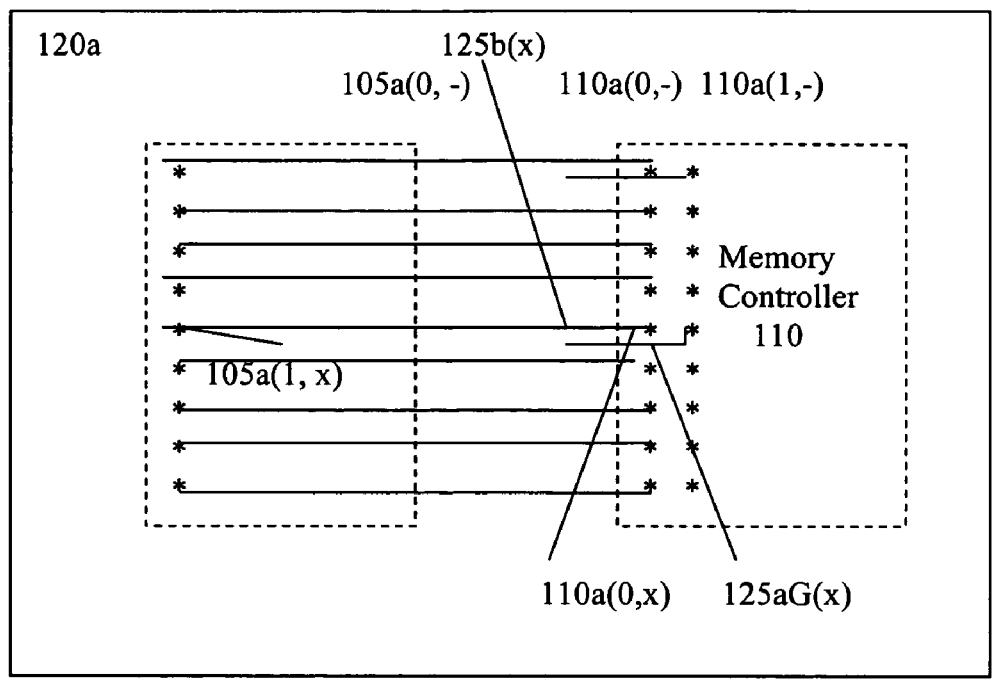
FIG. 5 is a block diagram of one layer of the memory system in accordance with an embodiment of the present invention.

Referring now to FIG. 5, there is illustrated a block diagram of one layer of the printed circuit board 120a, in accordance with another embodiment of the present invention. The layer 120a faces the package housing of the memory 105 and the memory controller 110. The rows of pins $110a(2,-)$ and $110a(3,-)$ can be connected to the row of pins on the memory 105 that are nearest to the memory controller, e.g., row $105a(0,-)$. According to certain aspects of the present invention, the memory controller 110 can be configured, such that each sequential pin of row $110a(2,x)$ connects to a corresponding sequential pin of row $105a(0,x)$. Each pin of row $110a(2,x)$ can be connected to a corresponding pin of row $105a(0,x)$ by a connection path $125a(x)$. As can be seen, the connection path $125a(x)$ can be the most direct path between the pins.

Each pin of row $110a(3,-)$ can be connected to ground GRND by corresponding connection paths $125aG(x)$ that runs substantially along and between connection paths $125a(x)$ and an adjacent path. In the foregoing manner, crosstalk between adjacent connections is reduced.

Figure 6:
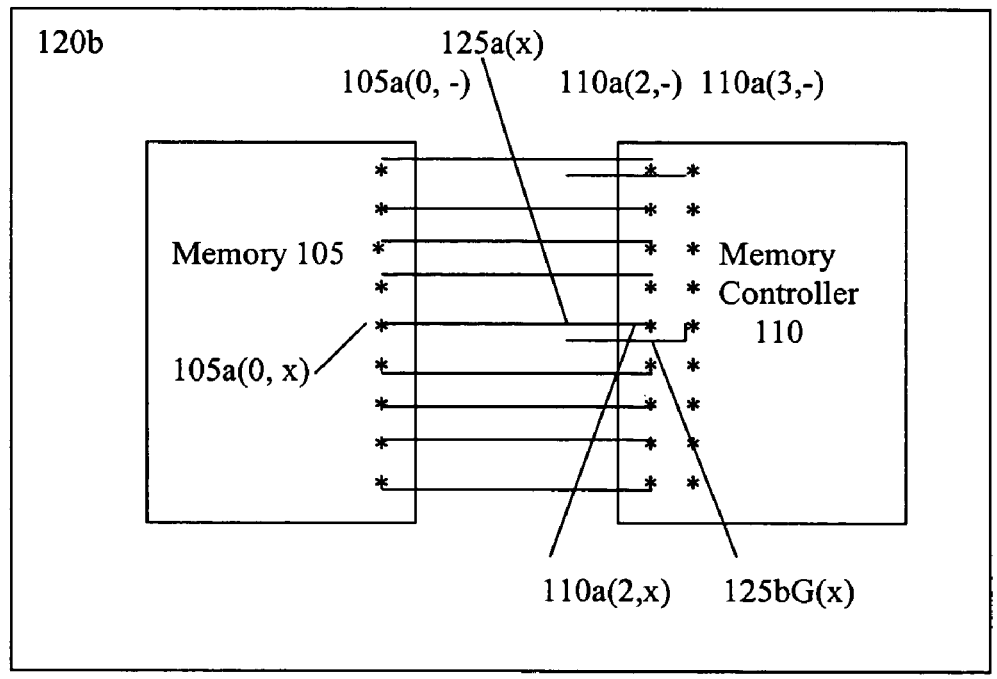
FIG. 6 is a block diagram of another layer of the memory system in accordance with an embodiment of the present invention.

Referring now to FIG. 6, there is illustrated a block diagram of another layer of the printed circuit board 120b in accordance with an embodiment of the present invention. The layer of printed circuit board 120b faces away from the package housing of the memory 105 and the memory controller 110. The rows of pins 105a(1), 110a(0,-) and 110a(1,-) are connected to layer 120b by vias 405. The row of pins 110a(0,-) can be connected to the row of pins on the memory 105 that are furthest from the memory controller, e.g., row 105a(1,-). According to certain aspects of the present invention, the memory controller 110 can be configured, such that each sequential pin of row 110a(0,x) connects to a corresponding sequential pin of row 105a(1,x). Each pin of row 110a(0,x) can be connected to a corresponding pin of row 105a(1,x) by a connection path 125b(x). As can be seen, the connection path 125b(x) can be the most direct path between the pins.

Each pin of row 110a(1,-) can be connected to ground GRND by corresponding connection paths 125bG (x) that runs substantially along and between connection paths 125b(x) and an adjacent path. In the foregoing manner, crosstalk between adjacent connections is reduced.

Figure 7:
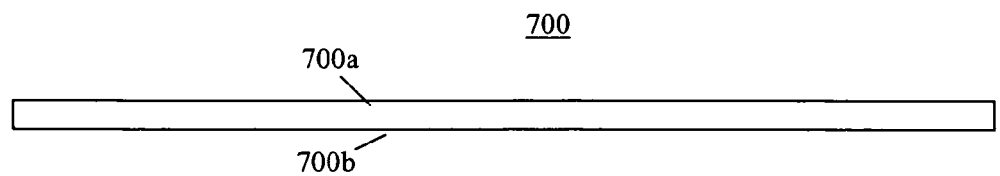
FIG. 7 is a block diagram of a cross section of an exemplary printed circuit board in accordance with an embodiment of the present invention.

Referring now to FIG. 7, there is illustrated a cross-sectional view of an exemplary printed circuit board 700 in accordance with an embodiment of the present invention. The printed circuit board comprises a first surface 700a and a second surface 700b.

Figure 8:
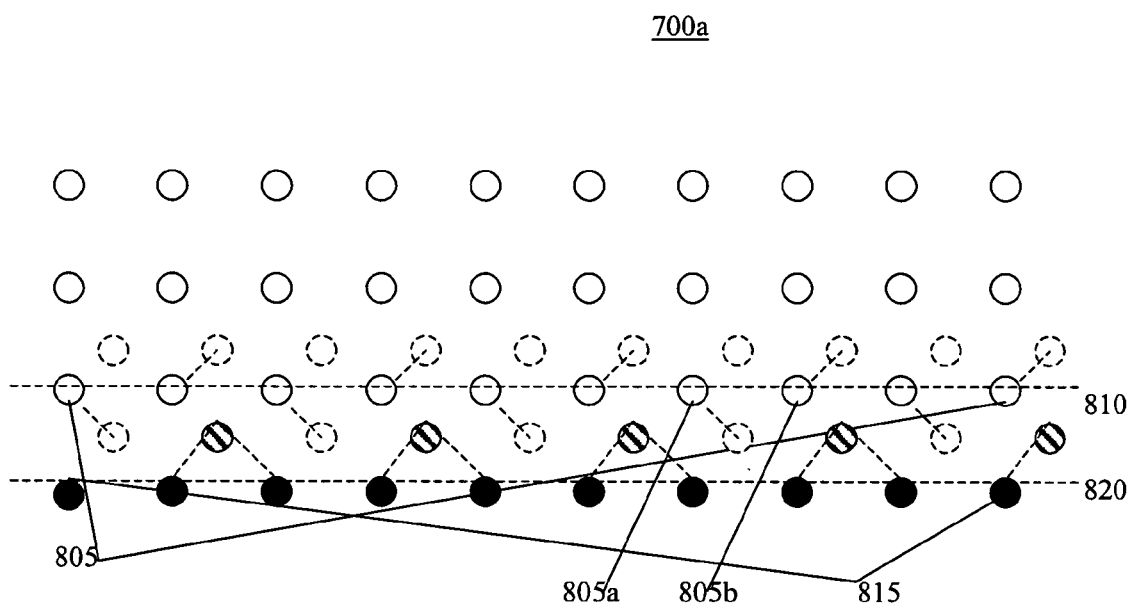
FIG. 8 is a block diagram of a top view of a first surface of an exemplary printed circuit board in accordance with an embodiment of the present invention.

FIG. 8 is an illustration of a top view of an exemplary first surface 700a of the printed circuit board 700 in accordance with an embodiment of the present invention. The printed circuit board comprises a plurality of vias 805. The plurality of vias 805 are positioned to form a substantially straight line 810 on the first surface 700a. The ground signals are denoted by the black circles, while the signals are denoted by the clear circles.

Figure 9:
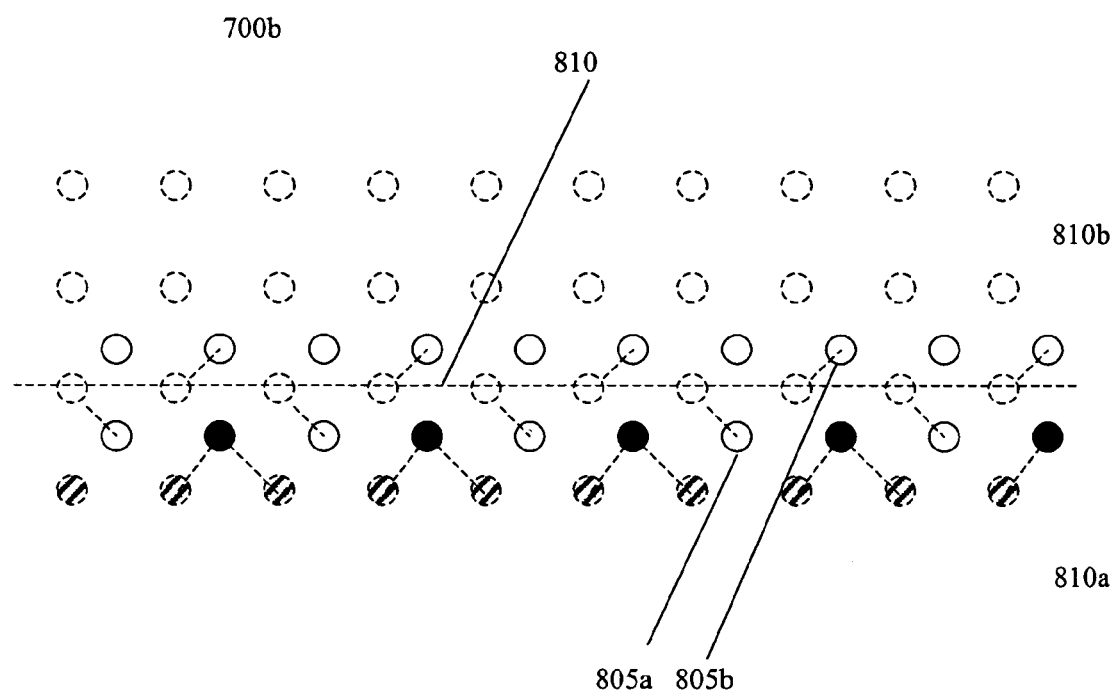
FIG. 9 is a block diagram of a top view of a second surface of an exemplary printed circuit board in accordance with an embodiment of the present invention.

FIG. 9 is an illustration of a top view of an exemplary second surface 700b of the printed circuit board 700 in accordance with an embodiment of the present invention. Among adjacent vias, e.g., 805a, and 805b, the first of the adjacent vias 805a emerges on the second surface 700b on one side 810a of the substantially straight line. The second via 805b emerges on the other side 810b of the substantially straight line 810.

As can seen, the signal contacts alternatively point upward and downward, creating an alternating "dog bone" configuration. This allows insertions of a ground via between signal vias, substantially reducing cross talk.

According to certain aspects of the present invention, the printed circuit board can comprise a second plurality of vias 815 forming another substantially straight line 820 on the first surface. Adjacent vias, e.g., 815a, can be connected on the second surface 700b. According to certain aspects of the present invention, the printed circuit board 700 can comprise a memory and memory controller as shown in FIG. 1. The first plurality of vias 805 can receive the plurality of pins 110a(2,-) of the memory controller 110, while the second plurality of vias 815a can receive the plurality of pins 110a(3,-). The pins 110a(0,-) and pins 110a(1,-) can make contact with the first surface.

While the present invention has been described with reference to certain embodiments, it will be understood by those skilled in the art that various changes may be made and equivalents may be substituted without departing from the scope of the present invention.

In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A board comprising:
   a first surface;
   a second surface connected to the first surface;
   a plurality of vias, wherein each of the plurality of vias has a center point, and wherein the center points of said plurality of via are positioned on a substantially straight line on the first surface; and
   wherein the plurality of vias comprises a first via and a second via, wherein the first via is a closest via of the plurality of vias to the second via, and wherein the first via emerges on the second surface on one side of the substantially straight line and wherein the second via emerges on an opposite side of the substantially straight line;
   and wherein the plurality of vias comprises three or more.

2. The board of claim 1, further comprising:
   a second plurality of vias, wherein each of the second plurality of vias has a center, and wherein the centers of said second plurality of vias are positioned to form a second substantially straight line on the first surface, wherein the substantially straight line and the second substantially straight line are parallel and wherein there are no vias except the plurality of vias and the second plurality of vias between the substantially straight line and the second substantially straight line.

3. The board of claim 2, further comprising:
   wherein the second plurality of vias emerge on the second surface on one side of the second substantially straight line parallel to the substantially straight line.

4. The board of claim 3, wherein adjacent ones of the second plurality of vias are connected on the second surface.

5. The board of claim 2, further comprising:
   an integrated circuit comprising a ball grid array, said ball grid array comprising a first plurality of pins and a second plurality of pins, and wherein each of the first plurality of pins are connected to corresponding ones of the first plurality of vias and wherein the second plurality of pins are connected to the second plurality of vias.

6. The board of claim 5, wherein the first plurality of pins carry signals and wherein the second plurality of pins carry ground signals.

7. The board of claim 5, wherein the integrated circuit comprises a memory controller.

8. The board of claim 7, further comprising a memory, said memory connected to the first surface and the second surface.

9. The board of claim 1, wherein the first via emerges on the second surface entirely on one side of the substantially straight line and wherein the second via emerges on the second surface entirely on the opposite side of the substantially straight line.

10. The board of claim 1, wherein the first via forms an angle with the substantially straight line that is less than 180 degrees, when measured from the substantially straight line to the first via in a particular one of the counter-clockwise or clockwise direction and the second via forms an angle with the substantially straight line that is more than 180 degrees, when measured from the substantially straight line to the second via in the same particular one of the counter-clockwise or clockwise direction.

11. The board of claim 1, wherein the substantially straight line traverses one end of the board to another end of the board.

12. A board comprising:
   a first surface for printing a plurality of printed circuits upon;
   a second surface for printing another plurality of printed circuits upon;

a plurality of vias for receiving a plurality of pins, wherein each of the plurality of vias has a center point, and wherein the center points of said plurality of via are positioned on a substantially straight line on the first surface; and wherein the plurality of vias comprises a first via and a second via, wherein the first via is a closest via of the plurality of vias to the second via, and wherein the first via emerges on the second surface on one side of the substantially straight line and wherein the second via emerges on an opposite side of the substantially straight line; and wherein the plurality of vias comprises three or more.

13. The board of claim 12, further comprising:

a second plurality of vias for receiving a second plurality of pins, said wherein each of the second plurality of vias has a center, and wherein the centers of second plurality of vias are positioned to form a second substantially straight line on the first surface, wherein the second substantially straight line is parallel to the substantially straight line and wherein there are no vias except the first plurality of vias and the second plurality of vias between the substantially straight line and the second substantially straight line.

14. The board of claim 13, further comprising:

wherein the second plurality of vias emerge on the second surface on one side of the second substantially straight line.

15. The board of claim 14, wherein adjacent ones of the second plurality of vias are connected on the second surface.

16. The board of claim 12, further comprising:

a memory controller, said memory controller comprising the plurality of pins, wherein said plurality of pins are inserted into the plurality of vias.

17. The board of claim 16, further comprising a memory for storing data, said memory connected to the first surface and the second surface.

18. The board of claim 12, wherein the first via emerges on the second surface entirely on one side of the substantially straight line and wherein the second via emerges on the second surface entirely on another side of the substantially straight line.

* * * * *